(12) United States Patent
Shor et al.

(10) Patent No.: US 8,236,691 B2
(45) Date of Patent: Aug. 7, 2012

(54) METHOD OF HIGH ASPECT RATIO PLUG FILL

(75) Inventors: Yakov Shor, Sheva (IL); Semeon Altshuler, Le Zion (IL); Maor Rotlain, Gat (IL); Yigal Alon, Gan Yavne (IL); Dror Horvitz, Bear Tuviya (IL)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/347,721

(22) Filed: Dec. 31, 2008

(65) Prior Publication Data

US 2010/0167532 A1 Jul. 1, 2010

(51) Int. Cl.
*H01L 21/60* (2006.01)
(52) U.S. Cl. ........ 438/675; 438/607; 438/641; 438/655; 438/656; 438/667; 257/E21.507
(58) Field of Classification Search .................. 438/607, 438/675; 257/E21.507
See application file for complete search history.

(56) References Cited

U.S. PATENT DOCUMENTS

| | | | | |
|---|---|---|---|---|
| 5,401,675 A * | 3/1995 | Lee et al. | ...... | 438/653 |
| 5,757,879 A * | 5/1998 | Joshi et al. | ...... | 378/35 |
| 5,918,141 A * | 6/1999 | Merrill | ...... | 438/583 |
| 5,986,312 A * | 11/1999 | Kuroda | ...... | 257/382 |
| 6,180,513 B1 * | 1/2001 | Otsuka et al. | ...... | 438/630 |
| 6,406,998 B1 * | 6/2002 | Prall et al. | ...... | 438/659 |
| 2003/0122179 A1 * | 7/2003 | Matsuki et al. | ...... | 257/314 |
| 2006/0033181 A1 * | 2/2006 | Farrar et al. | ...... | 257/532 |
| 2006/0216893 A1 * | 9/2006 | Wang et al. | ...... | 438/264 |
| 2008/0217776 A1 * | 9/2008 | Marangon et al. | ...... | 257/751 |
| 2008/0261066 A1 * | 10/2008 | Deligianni et al. | ...... | 428/545 |
| 2009/0170311 A1 * | 7/2009 | Kim et al. | ...... | 438/655 |
| 2010/0065949 A1 * | 3/2010 | Thies et al. | ...... | 257/621 |

* cited by examiner

Primary Examiner — Angel Roman
(74) Attorney, Agent, or Firm — Schwegman, Lundberg & Woessner, P.A.

(57) ABSTRACT

A method of plug fill for high aspect ratio plugs wherein a nucleation layer is formed at a bottom of a via and not on the sidewalls. The plug fill is in the direction from bottom to top of the via and not inwards from the sidewalls. The resulting plug is voidless and seamless.

7 Claims, 5 Drawing Sheets

METHOD OF HIGH ASPECT RATIO PLUG FILL

BACKGROUND OF THE INVENTION

1). Field of the Invention

Embodiments of this invention relate generally to semiconductor manufacturing. More specifically, embodiments of this invention relate to a method of plug fill for high aspect ratio plugs.

2). Discussion of Related Art

Existing plug fill techniques suggest conformal deposition of metals or top to bottom fill by sputtering. For example, a via is formed within a dielectric material formed on a semiconductor containing layer. Conductive material is deposited within the via down the sidewalls to the bottom of the via. The conductive material fills the via inward from the sidewalls and up from the bottom of the via. This results in a seam being formed when the via is filled. Also, prior art techniques typically use an adhesive barrier on the sidewalls.

In another example technique, a via is formed within a dielectric material formed on a semiconductor containing layer. Conductive material is deposited within the via by sputtering. When the conductive material is sputtered into the via, it collects on the sidewalls and on the bottom of the via. The conductive material fills the via inward from the sidewalls and up from the bottom of the via. This results in a seam being formed when the via is filled.

The prior art methods have a strong dependence on plug aspect ratio, so that at a high aspect ratio, the quality of the plug is significantly reduced. In these methods, the plug fill accumulates on the sidewalls and grows inward from the side walls. One of the known downsides is the creation of a seam. Further interaction with polishing can cause the seam to expose and further result in trapping polishing by-products. With node size reduction, the problem with plug aspect ratio becomes more crucial. Thus, plug fill with high aspect ratio for 45 nm node and beyond technologies, for example, requires completely new generation of hardware.

What is needed is a method of plug fill which avoids the problems discussed above regardless of the plug aspect ratio.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
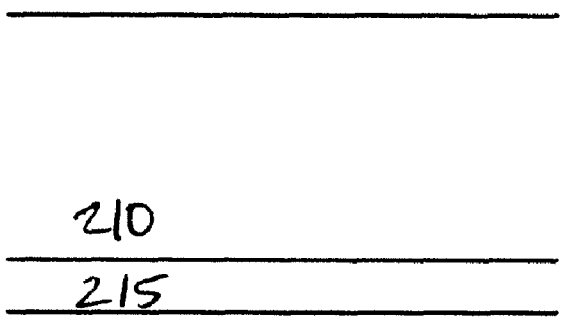
FIG. 1 is a cross-sectional side view of a dielectric layer formed on a semiconductor containing layer, according to one embodiment of the invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

By forming a nucleation layer only at the bottom surface of a via and allowing conductive fill material to grow upwards therefrom. With no nucleation placement present on the sidewalls, growth of the conductive fill material is prevented from the sidewalls inward. Thus, the forming of voidless and seamless plugs can be achieved.

Forming a Voidless and Seamless Plug Using a Nucleation Layer Formed by Deposition A nucleation layer may be formed on the bottom surface of a via by deposition to allow subsequent fill material to grow upwards from. FIG. 1 illustrates a dielectric layer 210 that is formed on a semiconductor containing layer 215.

Figure 2A:
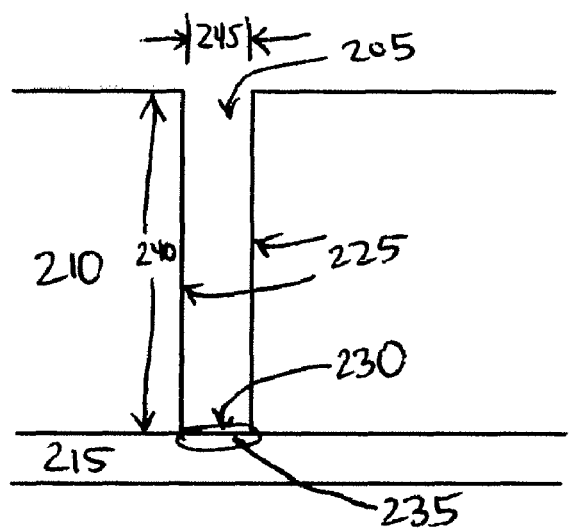
FIG. 2a is a cross-sectional side view similar to FIG. 1 after a via is formed within the dielectric layer, according to one embodiment of the invention.

As shown in FIG. 2a, a via 205 is formed within the dielectric layer 210. The via 205 may be formed in a variety of ways, for example, by etching. The via 205 extends to the semiconductor containing layer 215 so that a bottom surface 230 of the via 205 is a portion 235 of the semiconductor containing layer 215. Also shown are sidewalls 225 of via 205. The via 205 has an aspect ratio defined by a height 240 divided by width 245 of the via 205. In one embodiment, the aspect ratio is at least 10 to 1 (i.e., a height 240 which is at least ten times the width 245).

Figure 2B:
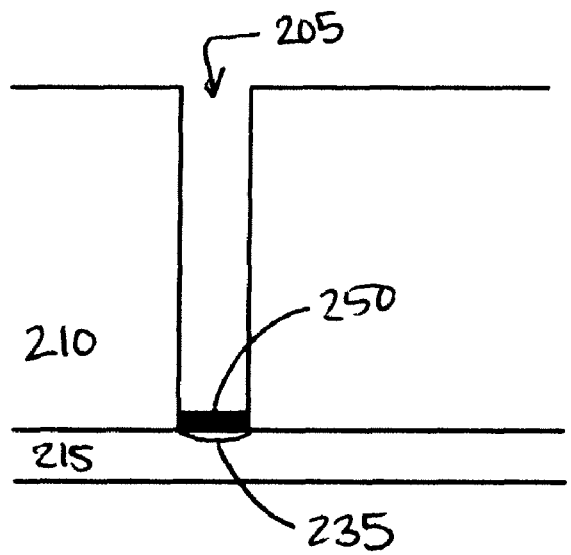
FIG. 2b is a cross-sectional side view similar to FIG. 2a after a nucleation layer is formed at the bottom of the via, according to one embodiment of the invention.

As shown in FIG. 2b, a nucleation layer 250 is formed on the bottom surface 230 of the via 205 only. More specifically, nucleation layer 250 is formed on the portion 235 of the semiconductor containing layer 215.

The nucleation layer 250 should be of sufficient thickness to act as a nucleation site for the subsequent fill material being deposited. It should be understood that because the nucleation layer 250 has a thickness, the nucleation layer 250 itself will be deposited on the bottom surface and be in contact with the sidewalls. When referring in this specification to no nucleation layer or conductive layer present on the sidewalls, it should be understood to not be referencing the nucleation layer 250 itself which is deposited on the bottom surface of the via and contacting the sidewalls.

The nucleation layer 250 promotes growth of the subsequent fill material deposited in the via 205 from itself upwards. In order to achieve bottom to top growth only, no nucleation layer or conductive layer is formed or present on the sidewalls. This eliminates any growth of the subsequent fill material from the sidewalls inward. It should be understood that while no fill material is preferred, an insignificant amount of fill material may inevitably be deposited on the sidewalls—e.g., some spotting may occur on the sidewalls. However, the amount should not be a continuous growth or enough to promote any significant growth from the sidewalls or to act like a nucleation site. The predominant growth should thus be from nucleation layer 250 upwards to the top of the via. Thus, the thickness of the growth of conductive material should be equivalent to the width of the (as opposed to a growth from each sidewall meeting in the middle with a thickness of one half the width of the via each.

The nucleation layer 250 may comprise a conductive material such as metals, silicides, borides, and nitrides. The conductive material may include titanium (Ti), Tungsten (W), or any of their alloys.

In one embodiment, the nucleation layer 250 is formed by deposition such as physical vapor deposition (PVD), chemical vapor deposition (CVD), atomic layer deposition (ALD), metal organic chemical vapor deposition (MOCVD), or plasma-enhanced chemical vapor deposition (PECVD). In a specific embodiment, the nucleation layer 250 is formed by collimated sputtering. With whichever deposition used, the deposition should be one directional so as to only allow the formation of a nucleation site on the bottom surface of the via. No significant growth or continuous accumulation should be present on the sidewalls.

Figure 2C:
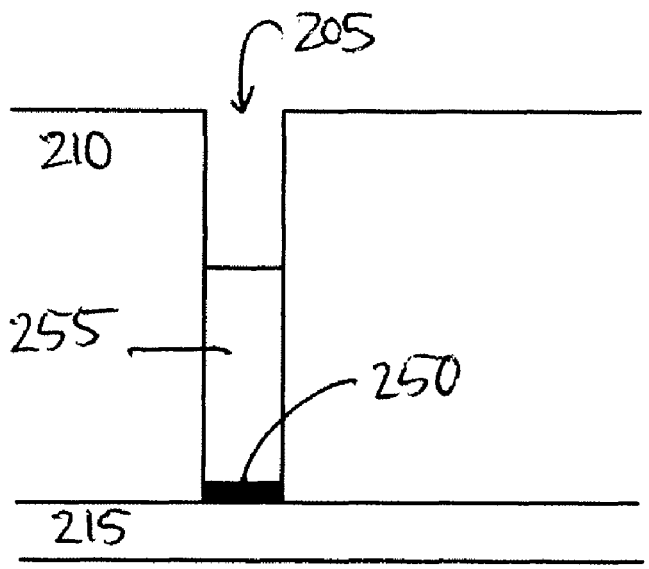
FIG. 2c is a cross-sectional side view similar to FIG. 2b after conductive fill material is deposited within the via, according to one embodiment of the invention.

As shown in FIG. 2c, a conductive fill material 255 is then deposited on the nucleation layer 250 from the bottom up and not inward from the sidewalls 225. The conductive fill material 255 should be deposited in the via and fill to a height equal to the height of the via 205. The growth direction defines by plug geometry and shape. Furthermore, no nucleation layer or conductive layer or barrier should be present on the sidewalls.

Again, it should be understood that while no fill material is preferred, an insignificant amount of fill material may inevitably be deposited on the sidewalls—e.g., some spotting may occur on the sidewalls. However, the amount should not be a continuous growth or enough to promote any significant growth from the sidewalls or to act like a nucleation site. Furthermore, no significant growth or accumulation of conductive fill material should be collected at the top surface dielectric layer 210 or top corners of via 205. Any deposit of fill material on the top surface of dielectric layer 210 or top corners of via 205 should be insignificant and not cause any continuous growth or act as a nucleation site. The predominant growth should thus be from nucleation layer 250 upwards to the top of the via. This allows for bottom to top growth, and not inwards from the sidewalls, when dealing with high aspect ratio plugs with large heights and very narrow widths.

The conductive fill material may comprise, for example, titanium, tungsten, and their alloys. The conductive fill material 255 may be deposited by, for example, PVD, CVD, ALD, MOCVD, or PECVD.

Figure 2D:
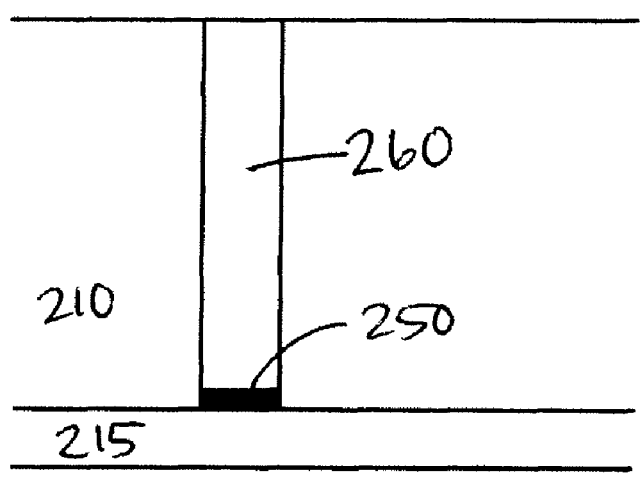
FIG. 2d is a cross-sectional side view similar to FIG. 2c after conductive fill material is deposited in the via to form a voidless and seamless plug fill, according to one embodiment of the invention.

FIG. 2d illustrates plug 260 when the conductive fill material 255 completely fills the via 205 and reaches the top of the via. Contact closure in the top is prevented and a voidless and seamless plug formation results, even in cases of high aspect ratio with narrow plug diameter and high plug height.

Figure 3A:
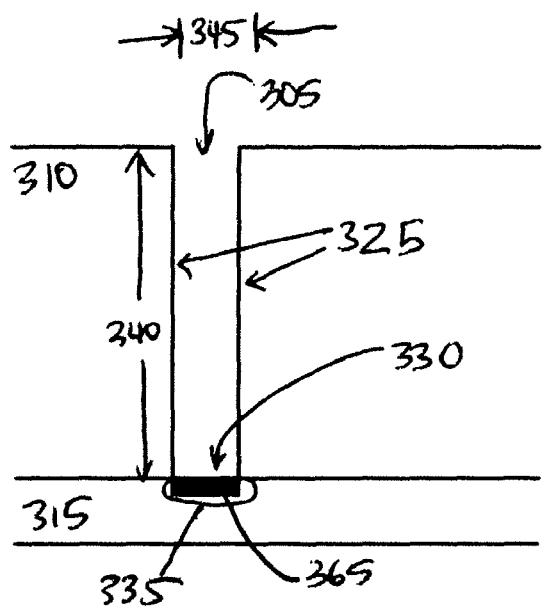
FIG. 3a is a cross-sectional side view of a via formed in a dielectric layer on a semiconductor containing layer after ions are implanted at the bottom of the via to form a nucleation layer, according to one embodiment of the invention.

Forming a Voidless and Seamless Plug Using a Nucleation Layer Formed by Ion Implantation Alternatively, a nucleation layer may be formed on the bottom surface of a via by metal ion implantation. As shown in FIG. 3a, a via 305 is formed within a dielectric material 310 as similarly describe for FIGS. 1-2a-b. As illustrated in FIG. 3a, a nucleation layer 365 is formed by ion implantation.

The nucleation layer 365 is formed by implanting metal ions into the bottom surface 330 of the via 305 (i.e., into the portion 335 of the semiconductor containing layer 315). A sufficient amount of ions should be implanted to act as a nucleation layer 350 for the subsequent fill material being deposited. The dose may vary depending on application and may have a magnitude, for example, on the order of E16 atoms/cm$^2$.

The ions should be implanted as close to 90° to the substrate base as possible, in order to avoid ion implantation on the sidewalls. While it is preferred that no ions are implanted on the sidewalls, it should be understood that an insignificant amount of ion implantation may occur on the sidewalls—e.g., near the bottom of the via. However, the amount of ions implanted should not be enough to promote a continuous growth of subsequent fill material from the sidewalls or to act like a nucleation site. Furthermore, no significant growth or accumulation of conductive fill material should be collected at the top surface dielectric layer 310 or top corners of via 305. Any deposit of fill material on the top surface of dielectric layer 310 or top corners of via 305 should be insignificant and not cause any continuous growth or act as a nucleation site. Furthermore, no nucleation layer or conductive layer is formed or present on the sidewalls. The predominant growth of subsequent fill material should thus be from nucleation layer 350 upwards to the top of the via.

Figure 3B:
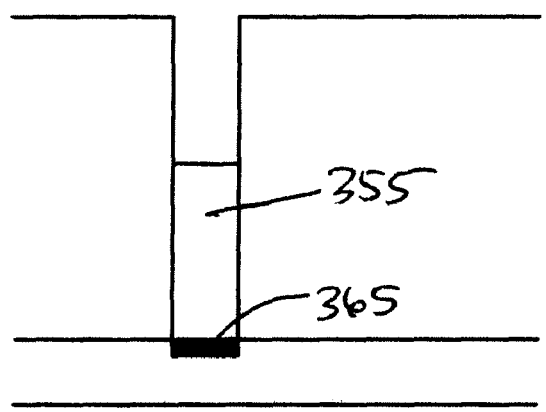
FIG. 3b is a cross-sectional side view similar to FIG. 3a after conductive fill material is deposited in the via, according to one embodiment of the invention.

As shown in FIG. 3b, conductive fill material 355 is then deposited on the nucleation layer 365 from the bottom up until reaching the top of the via 305. The conductive fill material should not grow inward from the sidewalls 325. The growth direction defines by plug geometry and shape. Again, it should be understood that while no fill material is preferred, an insignificant amount of fill material may inevitably be deposited on the sidewalls—e.g., some spotting may occur on the sidewalls. However, the amount should not be a continuous growth or enough to promote any significant growth from the sidewalls or to act like a nucleation site. The predominant growth should thus be from nucleation layer 350 upwards to the top of the via. This allows for bottom to top growth, and not inwards from the sidewalls, when dealing with high aspect ratio plugs with large heights and very narrow widths.

Figure 3C:
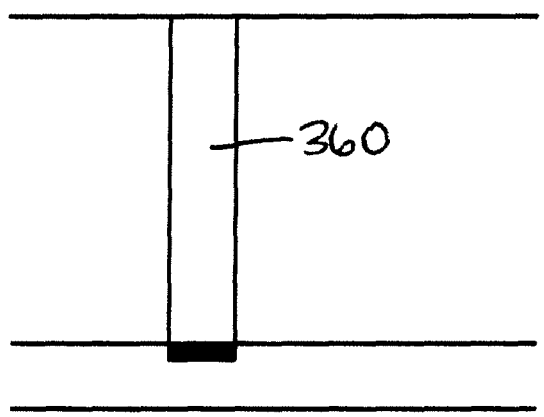
FIG. 3c is a cross-sectional side view similar to FIG. 3b after conductive fill material is deposited in the via to form a voidless and seamless plug fill, according to one embodiment of the invention.

The conductive fill material may comprise, for example, titanium, tungsten, and their alloys. The conductive fill material 355 may be deposited by, for example, PVD, CVD, ALD, MOCVD, or PECVD. As shown in FIG. 3c, the conductive fill material 355 completely fills the via and results in a voidless and seamless plug 360.

Forming a Voidless and Seamless Plug by Using a Silicide Layer Initially at Contact Metallization Alternatively, a silicide layer may be formed between the semiconductor containing layer and the dielectric layer before the via is formed. The silicide layer may then be used as a nucleation layer when a via is formed.

Figure 4A:
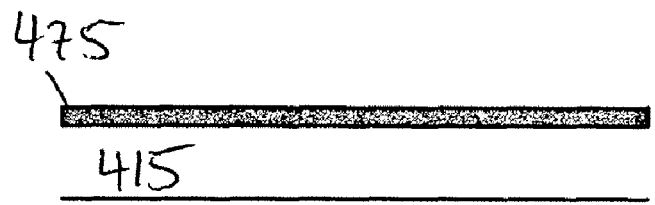
FIG. 4a is a cross-sectional side view of a silicide layer formed on a semiconductor containing layer, according to one embodiment of the invention.

As shown in FIG. 4a, a silicide layer 475 is formed on a semiconductor containing layer 415. The silicide layer 475 may comprise a conductive material—e.g., tungsten silicide (WSix), titanium silicide (TiSix), cobalt silicide (CoSix), and nickel silicide (NiSix). The silicide layer may be formed by, for example, by PVD or CVD deposition of metal with following silicide formation by reaction with Si from substrate or as deposited silicide.

Figure 4B:
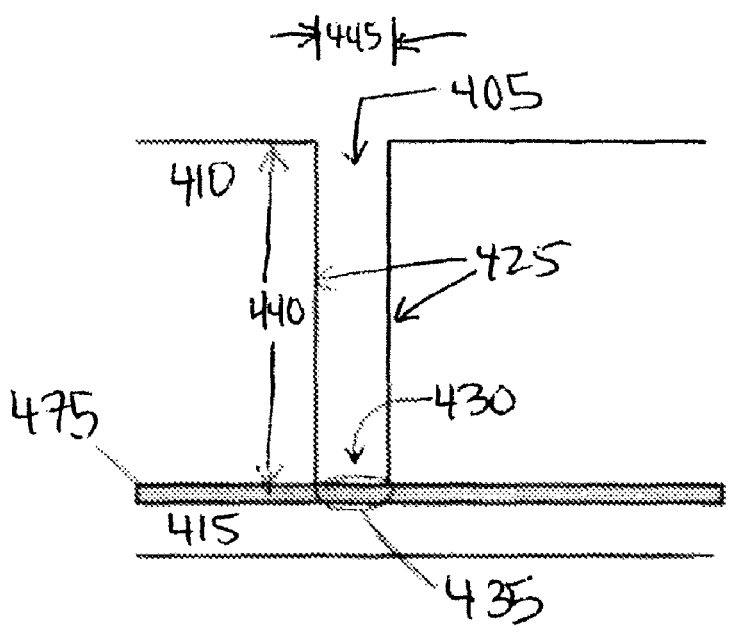
FIG. 4b is a cross-sectional side view similar to FIG. 4a after a dielectric layer and via are formed on the semiconductor layer, according to one embodiment of the invention.

As shown in FIG. 4b, a dielectric layer 410 is then formed on the semiconductor layer 415 with the silicon layer 475 formed between. A via 405 is formed within the dielectric layer 415. The via 405 may be formed in a variety of ways, for example, by etching. The via 405 extends to the silicide layer 475 so that a bottom surface 430 of the via 405 is a portion 435 of the silicide layer 475. The via 405 has an aspect ratio defined by a height 440 by width 445 of the via 405. In one embodiment, the aspect ratio is at least 10 to 1 (i.e., a height 440 which is at least ten times the width 445)

The silicon layer 475 should be of sufficient thickness to allow a portion 435 of the silicide layer 475 to act as a nucleation layer on only the bottom surface 430 of the via 405. The nucleation layer promotes growth of the subsequent fill material deposited in the via 405 from itself upwards. In order to achieve bottom to top growth only, no nucleation layer or conductive layer is formed or present on the sidewalls.

Figure 4C:
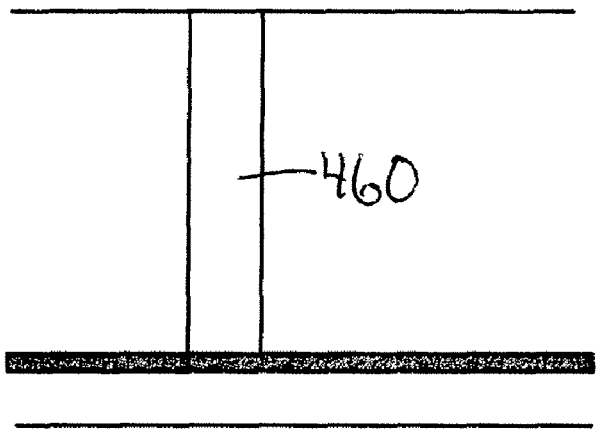
FIG. 4c is a cross-sectional side view similar to FIG. 4b after conductive fill material is deposited within the via, according to one embodiment of the invention.

As shown in FIG. 4c, conductive fill material 455 is then deposited from the bottom up on the portion of the silicide layer 475 which is acting as a nucleation layer. Since no nucleation layer or conductive layer is present on the sidewalls, this eliminates any growth of the subsequent fill material from the sidewalls inward. Again, it should be understood that while no fill material is preferred, an insignificant amount of fill material may inevitably be deposited on the sidewalls—e.g., some spotting may occur on the sidewalls. However, the amount should not be a continuous growth or enough to promote any significant growth from the sidewalls or to act like a nucleation site. Furthermore, no significant growth or accumulation of conductive fill material should be collected at the top surface dielectric layer 410 or top corners of via 205. Any deposit of fill material on the top surface of dielectric layer 410 or top corners of via 205 should be insignificant and not cause any continuous growth or act as a nucleation site. The predominant growth should thus be from nucleation layer 435 upwards to the top of the via.

The conductive fill material may comprise, for example, titanium, tungsten, and their alloys. The conductive fill material 455 may be deposited by, for example, PVD, CVD, ALD, MOCVD, or PECVD. As shown in FIG. 4c, the conductive fill material 455 completely fills the via and results in a voidless and seamless plug 360.

Figure 5:
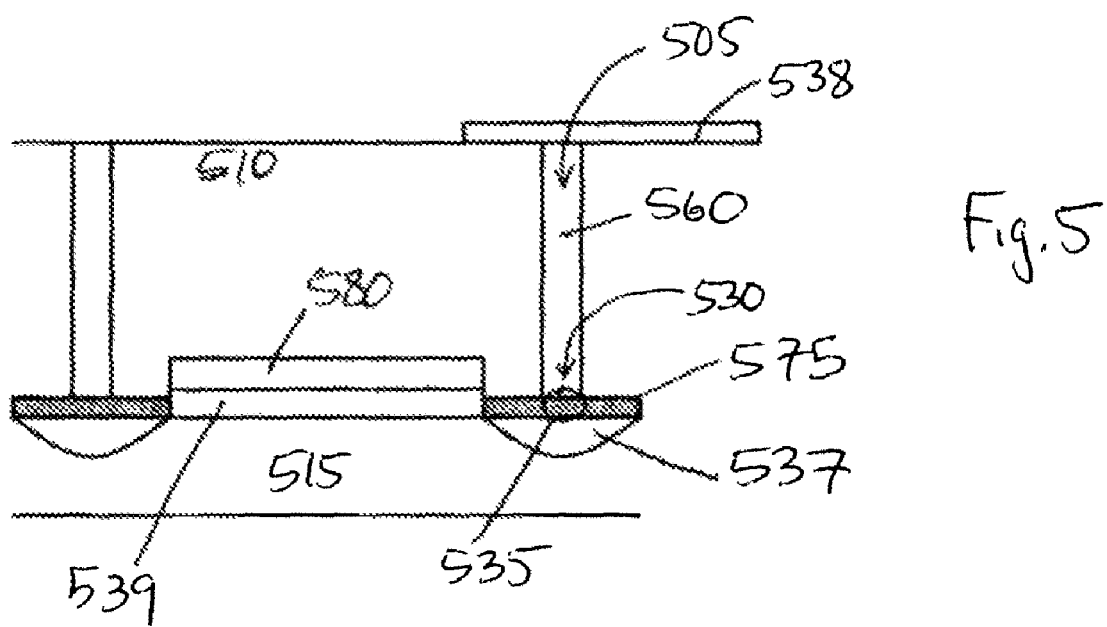
FIG. 5 is a cross-sectional side view of a silicide layer specifically formed on a portion of a semiconductor containing layer corresponding to an N or P doped region of a transistor, according to one embodiment of the invention.

In one embodiment, the silicide layer 575 is specifically formed on a portion 537 of the semiconductor containing layer 515 corresponding to an N or P doped region of a transistor, as shown in FIG. 5. For example, a silicide region may be been selectively formed on the source or drain region of a CMOS transistor.

As shown, a polysilicon layer 580 and gate dielectric layer 539 are formed on semiconductor containing layer 515 with silicide layer 575 formed on the portion 537 of the semiconductor containing layer 515 where the doped region is located. A dielectric layer 510 is formed over the semiconductor containing layer 515, the polysilicon layer 580, and the silicide layer 575.

A via 505 (shown here filled with conductive fill material to form plug 560) is then formed within the dielectric layer 515. The via 505 extends to the silicide layer 575 so that a bottom surface 530 of the via 505 is a portion 535 of the silicide layer 575. Conductive fill material is then deposited on the portion 535 acting as the nucleation layer from the bottom up and not inward from the sidewalls 525, as similarly described in FIGS. 4b-c. Metal line 538 is formed on dielectric layer 510 and electrically couples the via to another part of the circuit board.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method comprising:
    forming a dielectric layer on a semiconductor containing layer;
    forming a via in the dielectric layer, the via extending to the semiconductor containing layer such that a bottom surface of the via is a portion of the semiconductor containing layer;
    utilizing a one directional collimated sputtering deposition technique, depositing a nucleation layer on only the bottom surface of the via and not on sidewalls of the via; and
    utilizing a chemical vapor deposition (CVD) technique, depositing a conductive fill material on the nucleation layer up to a top of the via to create a seamless plug fill, the conductive fill material being grown from the bottom up and not inward from the sidewalls and filling a bulk of the via.

2. The method of claim 1, wherein the nucleation layer comprises at least one conductive material selected from a group consisting of metal, silicide, boride, and nitride.

3. The method of claim 1, wherein the nucleation layer comprises titanium.

4. The method of claim 1, wherein a height of the via is at least 10 times a width of the via.

5. The method of claim 1, wherein the conductive fill material deposited on the nucleation layer comprises at least one conductive material selected from a group consisting of titanium, tungsten, and their alloys.

6. The method of claim 1, wherein the CVD technique is selected from the group consisting of CVD, MOCVD, and PECVD.

7. The method of claim 1, wherein the forming of the via is performed by etching.

* * * * *